United States Patent
McIntosh et al.

(10) Patent No.: US 6,627,885 B1
(45) Date of Patent: Sep. 30, 2003

(54) METHOD OF FOCUSED ION BEAM PATTERN TRANSFER USING A SMART DYNAMIC TEMPLATE

(75) Inventors: John M. McIntosh, Orlando, FL (US); Erik C. Houge, Orlando, FL (US); Fred A. Stevie, Orlando, FL (US); Catherine Vartuli, Windermere, FL (US); Scott Jessen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 220 days.

(21) Appl. No.: 09/631,545

(22) Filed: Aug. 3, 2000

(51) Int. Cl.[7] .............................................. H01J 37/26
(52) U.S. Cl. ..................... 250/309; 250/310; 250/492.2
(58) Field of Search ................................ 250/307, 309, 250/310, 492.2

(56) References Cited

U.S. PATENT DOCUMENTS

| | | | | |
|---|---|---|---|---|
| 5,502,306 A | * | 3/1996 | Meisburger et al. | 250/310 |
| 5,578,821 A | * | 11/1996 | Meisberger et al. | 250/310 |
| 5,717,204 A | * | 2/1998 | Meisburger et al. | 250/310 |
| 6,197,455 B1 | * | 3/2001 | Yedur et al. | 430/5 |
| 6,426,501 B1 | * | 7/2002 | Nakagawa | 250/310 |

* cited by examiner

Primary Examiner—Jack Berman
Assistant Examiner—Johnnie L Smith, II

(57) ABSTRACT

The present invention provides a method of forming a dynamic template with a focused beam. The method includes forming a desired template that represents a desired image, forming an actual template that represents an actual image, such as a photolithographic mask or a semiconductor device feature, and comparing the desired template to the actual template to yield a deviation template. In one embodiment the deviation template is formed by subtracting the actual template from the desired template.

11 Claims, 5 Drawing Sheets

000
METHOD OF FOCUSED ION BEAM PATTERN TRANSFER USING A SMART DYNAMIC TEMPLATE

TECHNICAL FIELD OF THE INVENTION

The present invention is directed, in general, to a method of forming a template and, more specifically, to a method of forming a dynamic template with a focused beam, and a system for use therein.

BACKGROUND OF THE INVENTION

The semiconductor manufacturing industry is continually striving to manufacture smaller, faster and more reliable semiconductor devices. In its efforts to manufacture smaller, faster and more reliable semiconductor devices, the semiconductor manufacturing industry relies heavily on the ability to quickly and accurately add or remove a material from a precise microscopic pattern on a semiconductor device. For instance, it is common for material to be added or removed from microscopic patterns including circuit devices, such as trenches, interconnects, or photolithographic masks. This material is generally added or removed to correct a defect within the pattern.

Photolithographic masks are an important component in conventional semiconductor manufacturing processes. Thus, it is extremely important that the photolithographic masks be free of defects during patterning. Since the photolithographic mask is part of the beginning processing step used to define a device, any defect that is present in the photolithographic mask, typically is carried throughout the manufacturing process. Generally, defects in photolithographic masks may arise because of poor manufacturing, stray particles or use of the mask.

A set of photolithographic masks are typically quite expensive to manufacture and represent a major expense component to semiconductor manufacturers. The semiconductor manufacturing industry, in an attempt to reduce the escalating cost of replacing these photolithographic masks, developed a method of repairing such defects. Currently the semiconductor manufacturing industry uses a focused ion beam (FIB) tool to both add and remove material from precise microscopic patterns in the photolithographic masks.

To correct a defect in a photolithographic mask using the FIB process, the FIB tool manually follows a 2-dimensional template pattern that is transferred by a raster of a FIB beam. The raster of the FIB beam has a modulated dwell time at each pixel of the template; therefore, the amount of material removed or deposited depends on the dwell time at each pixel. The current process is generally capable of repairing most defects that may be detected in the microscopic pattern. However, it is severely limited by its manual characteristic, and as a result, has several drawbacks.

One of the drawbacks, is that it is only currently practical to use the FIB tool to repair a defect having a 2-dimensional projection, such as a uniform trench or hole, and not a defect having a 3-dimensional component. The problem is that simply stacking a series of fixed 2-dimensional templates propagates errors in the etching or deposition rate, accumulatively, and severely restricts any Z dimension complexity or variability of dimension or translation, during the FIB process. This introduces errors in the defect correction process.

Another drawback is that the current process is incapable of supporting even rudimentary automation. Thus, the current process requires an excessive amount of skill and time, and is non-repeatable. Moreover, unnecessary ion beam damage to the surface of the semiconductor device results from the current process. As the majority of the above discussion is focused on photolithographic masks, the FIB process may also be used to construct or correct defects in semiconductor features, such as trenches and interconnects. The same drawbacks occur when correcting defects in these semiconductor features, as occur.when correcting defects in photolithographic masks.

Accordingly, what is needed in the art is a process of accurately repairing defects on a precise microscopic pattern, that does not experience the.drawbacks experienced using the prior art process.

SUMMARY OF THE INVENTION

To address the above-discussed deficiencies of the prior art, the present invention provides a method of forming a dynamic template with a focused beam. The method includes forming a desired template that represents a desired image, forming an actual template that represents an actual image, such as a photolithographic mask or a semiconductor device feature, and comparing the desired template to the actual template to yield a deviation template. In one embodiment, the deviation template is formed by subtracting the actual template from the desired template.

Another embodiment taught by the present invention includes a dynamic template modification system for forming a semiconductor feature. The dynamic template modification system includes (1) a desired template that represents a desired semiconductor feature, (2) a scanning subsystem that generates an actual template that represents an actual semiconductor feature, (3) a template comparison subsystem, associated with the scanning subsystem, that analyzes the desired template and the actual template and generates a deviation template therefrom, and (4) a dynamic formation subsystem, associated with the scanning subsystem and the template comparison subsystem, that modifies the actual semiconductor feature using the deviation template and a focused beam subsystem, to substantially conform the actual semiconductor feature to the desired semiconductor feature.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
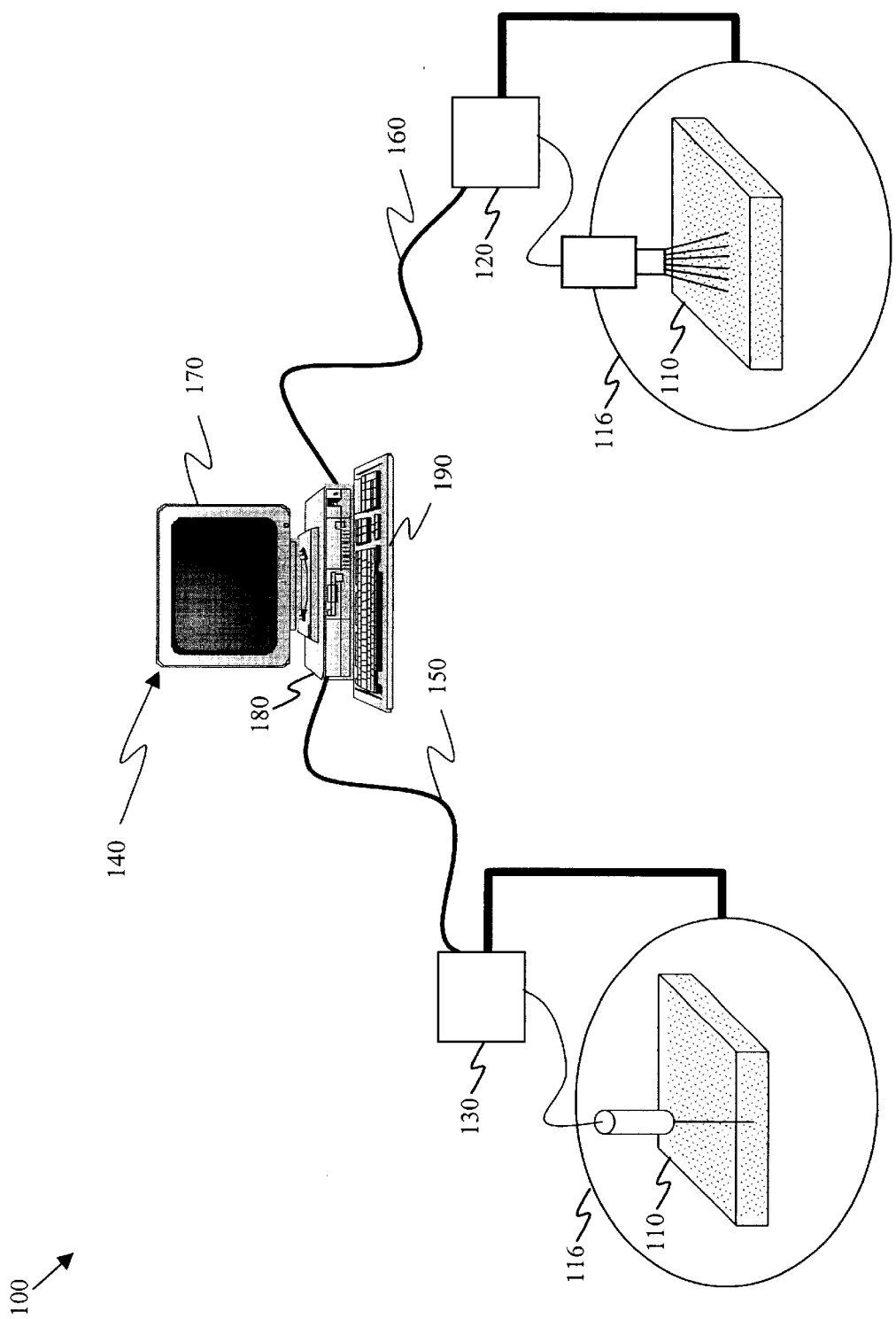
FIG. 1 illustrates a dynamic template modification system for forming a semiconductor feature, which forms one environment within which the present invention can operate.

Referring initially to FIG. 1, there is illustrated a dynamic template modification system for forming or repairing a semiconductor feature, generally designated 100, that forms one environment within which the present invention can operate. The system 100 includes a partially completed actual semiconductor feature 110. The actual semiconductor feature 110 may be a variety of features used in the manufacture of a semiconductor device, such as an integrated circuit. For example, the actual semiconductor feature 110 may be a trench, via, gate or other similar semiconductor structure. Alternatively, however, the actual semiconductor feature 110 may be a feature used to actually form the desired semiconductor structure, such as a photolithographic mask. In the illustrated embodiment, the actual semiconductor feature 110 is shown located on a platen 116, during an intermediate phase of a fabrication process. The actual semiconductor feature 110 can be multiple portions of, or the entire semiconductor feature. Furthermore, the actual semiconductor feature 110 may be a completed semiconductor feature having defects, or it may be a partially completed actual semiconductor feature 110 mentioned above.

A scanning apparatus 120 may be associated with the actual semiconductor feature 110. In the illustrated embodiment, the scanning apparatus 120 is advantageously located over the actual semiconductor feature 110 and is capable of accurately generating a 3-dimensional template of the actual semiconductor feature 110. Template, as referred to in the present application, refers to a representation of a feature, whether it be a mathematical, optical or other similar type of representation. One having skill in the art knows that the scanning apparatus 120 may be positioned in any manner such that the 3-dimensional template of the actual semiconductor feature 110 can be generated. It should also be noted that the scanning apparatus 120 can be a focused beam apparatus as described below. In such a situation, the focused beam apparatus generates a template of the actual semiconductor feature 110 by collecting secondary electrons to form a rastered image, such as a scanning electron microscope (SEM) image.

Further associated with the actual semiconductor feature 110 and the platen 116, is a conventional focused beam apparatus 130. In the illustrated embodiment of the present invention, the focused beam apparatus 130 is a focused ion beam apparatus advantageously positioned over the actual semiconductor feature 110. The focused beam apparatus 130 is capable of accurately adding or removing small amounts of material from the actual semiconductor feature 110. In other embodiments of the present invention, other focused beam devices capable of adding or removing small amounts of material from the actual semiconductor feature 110 may be used.

The system 100 also comprises a computer system 140. The computer system 140 is coupled to the scanning apparatus 120 and the focused beam apparatus 130 via connection devices 150, 160, and is uniquely configured to receive or process information from or transmit instructions to the scanning apparatus 120 and the focused beam apparatus 130. In one embodiment of the present invention, the computer system 140 may be software in a conventional personal computer. The software embodiment includes source code, object code, libraries, executable programs and other software structures that cooperatively function together to achieve the functionality of the present invention. The computer system 140 may also include a monitor 170, a chassis 180 or user interface 190, such as a keyboard. Alternatively, however, the monitor 170 and the keyboard may be replaced by other conventional output and input devices, respectively. In an exemplary embodiment, the focused beam apparatus 130 and the scanning apparatus 120 are connected to separate computer systems 140 having separate memories, which in another embodiment may be linked together.

It should be noted that any conventional computer system 140 having at least one CPU is suitable to function as the computer system 140, including without limitation, hand-held units, laptop/notebook, mini, mainframe and supercomputers, including RISC and parallel processing architectures, as well as combinations of such systems. Conventional computer system architecture is more fully discussed in *Computer Organization and Architecture*, by William Stallings, MacMillan Publishing Co. (3rd ed. 1993) and incorporated herein by reference. Alternative computer system embodiments may be firm-or hardware-based.

The system 100 generates an actual template that represents the actual semiconductor feature 110, compares a desired template that represents a desired semiconductor feature to the actual template, and generates a deviation template from this comparison. The deviation template, in conjunction with the focused beam apparatus 130, is then used to substantially conform the actual semiconductor feature 110 to the desired semiconductor feature. This allows the actual semiconductor feature 110 to be alleviated of defects, without manufacturing a new semiconductor feature. This may be highly beneficial when applied to a semiconductor feature, such as a photolithographic mask, which can substantially reduce manufacturing costs by extending the useful life of the photolithographic mask and down time associated with obtaining a new photolithographic mask.

Figure 2:
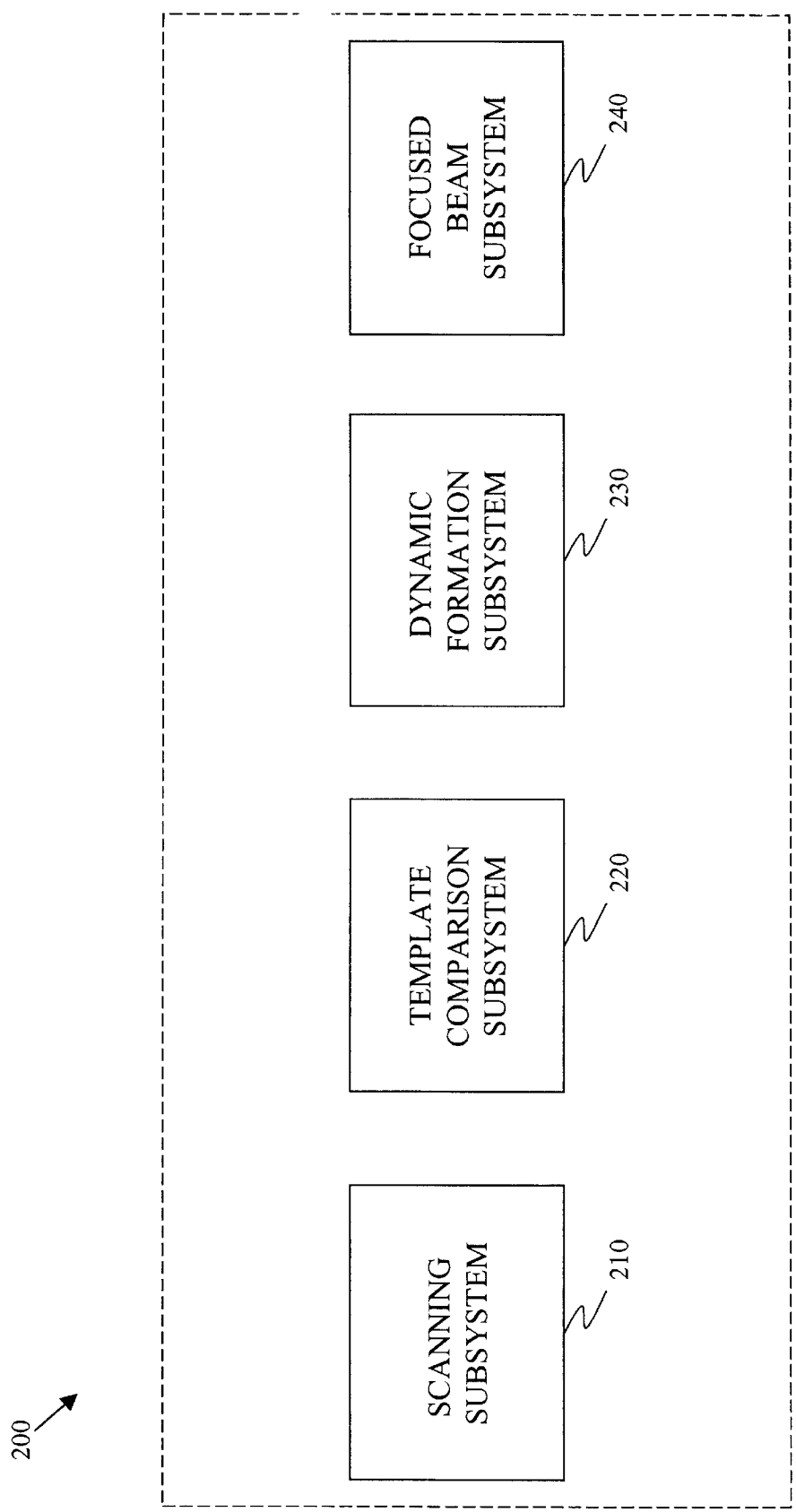
FIG. 2 illustrates subsystems of the dynamic modification system constructed according to the principals of the present invention.

Turning to FIG. 2 with continued reference to FIG. 1, illustrated is a block diagram of a dynamic template modification system 200 constructed according to the principles of the present invention. The dynamic template modification system 200 comprises a scanning subsystem 210 and may be embodied in software, hardware or a combination thereof. In one embodiment, the scanning subsystem 210 may be embodied within the computer system 140. In an exemplary embodiment, the scanning subsystem 210 generates an actual template that represents an actual semiconductor feature 110. The actual template in an exemplary embodiment. is a 3-dimensional representation of the actual semiconductor feature 110, and may be obtained by taking multiple 2-dimensional slices along a given dimension, which for purposes of the following discussion will be the Z-dimension. In another embodiment, the scanning subsystem 210 includes the scanning apparatus 120 discussed above, and obtains the actual template using the scanning apparatus 120. In yet another embodiment, the focused beam apparatus 130 may function as the scanning apparatus 120, alleviating the need to purchase and operate both the scanning apparatus 120 and the focused beam apparatus 130.

In an alternative embodiment, the scanning subsystem 210 also generates a desired template that represents a desired semiconductor feature. However, regardless of whether the desired template is generated by the scanning subsystem 210, including the scanning apparatus 120, or was previously obtained and was stored on an external medium, the desired template is a 3-dimensional representation of the desired semiconductor feature. As with the actual template, the desired template is obtained by using the scanning apparatus 120 and taking multiple two-dimensional slices of the desired semiconductor feature along the Z-dimension.

Also included in the dynamic template modification system 200 is a template comparison subsystem 220, associated with the scanning subsystem 210 and may be embodied in software, hardware or a combination thereof. In one embodiment, the template comparison subsystem 220 may be embodied in the computer system 140. The template comparison subsystem 220, analyzes the desired template and the actual template and generates a deviation template therefrom. In an advantageous embodiment, the template comparison subsystem 220 generates the deviation template using a mathematical comparison of the actual template and the desired template. However, in an alternative embodiment the deviation template may be generated using optical interference patterns. Optical interference patterns are similar to those used with holographic imaging systems. Background information concerning holographic images and holographic imaging systems are discussed in *Holographic Memories*, by Demetri Psaltis and Pai Mok, Scientific America (November 1995), incorporated herein by reference.

Figure 3:
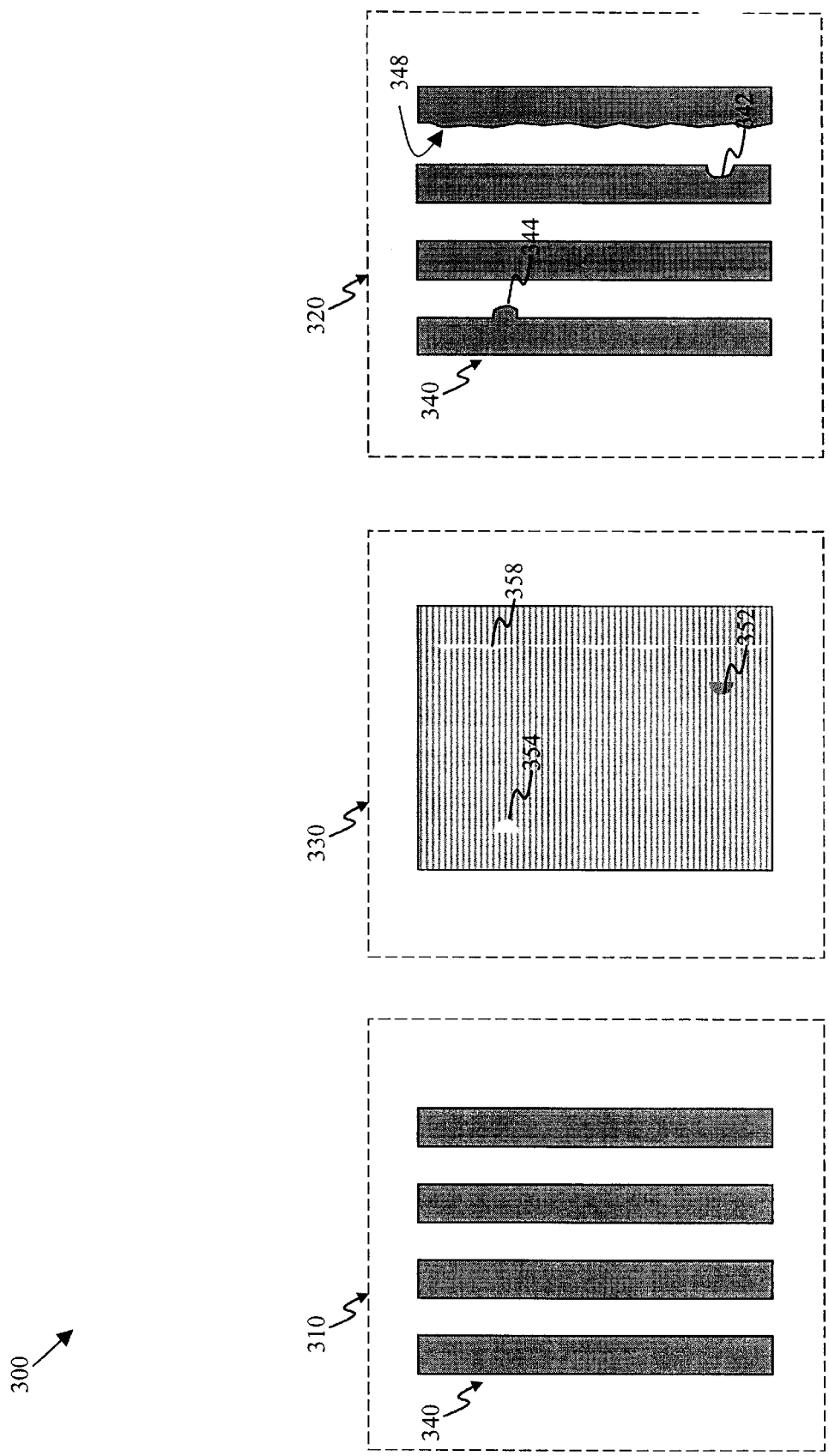
FIG. 3 illustrates a template comparison example, including a desired template, an actual template and a deviation template.

Turning to FIG. 3, illustrated is a template comparison example 300, including a desired template 310, an actual template 320 and a deviation template 330. Each of the templates 310, 320, 330, represents a 2-dimensional slice at a given Z-dimension height. The dark area 340 in the desired template 310 and the actual template 320, represents where a given material is present. As illustrated, the actual template 320 contains a negative defect 342, a positive defect 344 and an edge profile defect 348. It should be recognized that the number, shape and type of defect will most likely vary from one device to another. By comparing the desired template 310 and the actual template 320, the deviation template 330 is generated. As mentioned above, the comparison may be a mathematical comparison, a comparison of optical interference patterns or other similar comparison. What results is the deviation template 330 that includes a representative negative defect 352 and a representative positive defect 354 and a representative positive edge defect 358. The representative positive defects 354, 358, are differentiated from the representative negative defects 352 so that the focused beam apparatus 130 can be appropriately directed to either deposit material or remove a material as required by design. In the illustrated example the representative negative defect 352 is the darkest area and the representative positive defects 354, 358, are the lightest area.

Referring again briefly to FIG. 2, a dynamic formation subsystem 230 is also included in the dynamic template modification system 200 and may be embodied within software, hardware or a combination thereof. The dynamic formation subsystem 230 is associated with the scanning subsystem 210 and the template comparison subsystem 220 and modifies the actual semiconductor feature 110 using the deviation template 330 and a focused beam subsystem 240. In the illustrated example of FIG. 3, the focused beam subsystem 240, which in one embodiment includes the focused beam apparatus 130, deposits material in the representative negative defect 352 and removes material in the representative positive defects 354, 358. Furthermore, the dynamic formation subsystem 230 attempts to substantially conform the actual semiconductor feature 110 to the desired semiconductor feature. The actual semiconductor feature 110 is modified, as discussed above, at each of the Z-dimension slices discussed above.

Figure 4:
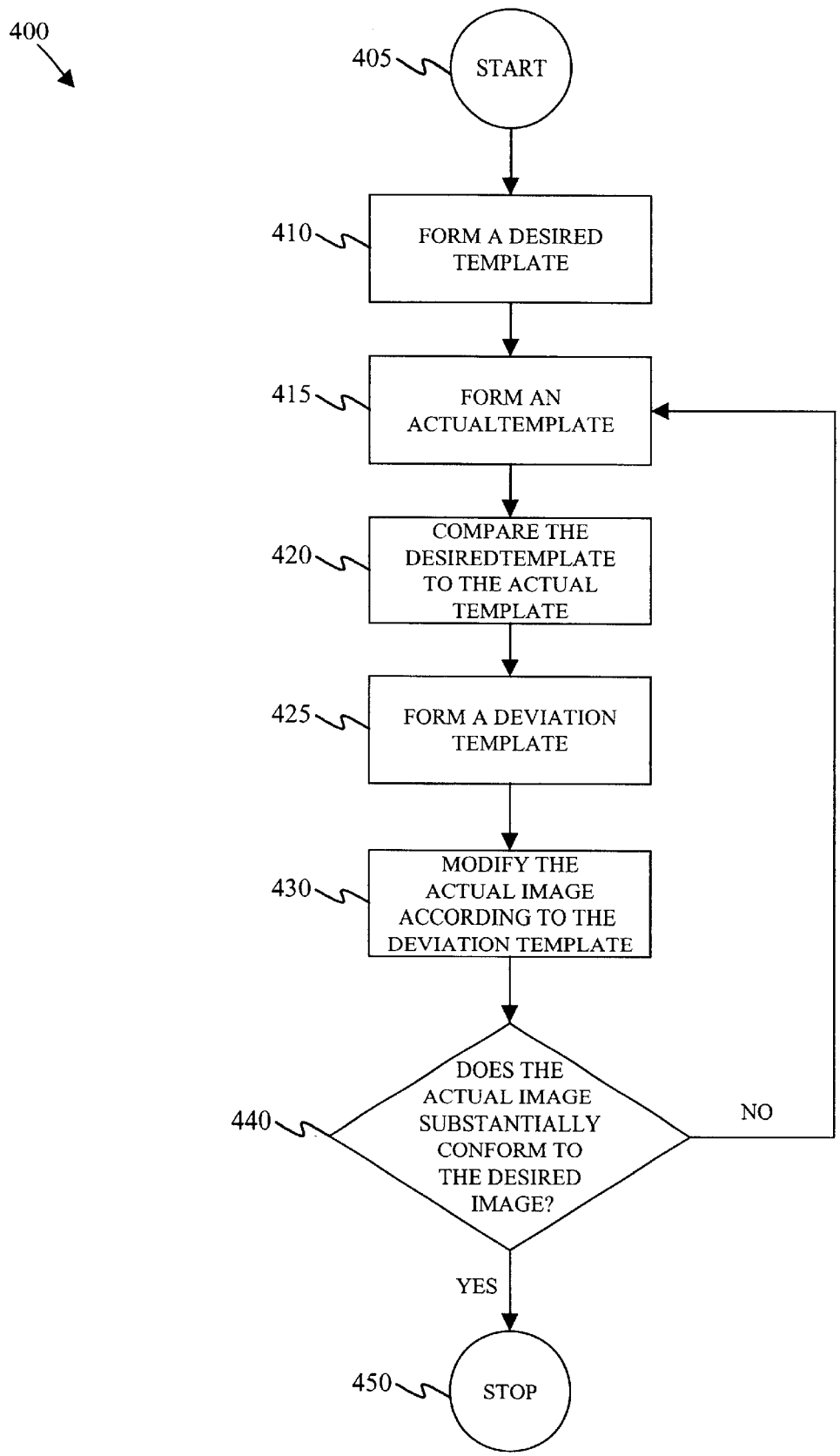
FIG. 4 illustrates a flow diagram of a method of forming a dynamic template with a focused beam apparatus.

Turning now to FIG. 4 with continued reference to FIGS. 1, 2, and 3, illustrated is a flow diagram 400 of a method of forming a dynamic template 330 with a focused beam apparatus 130. In FIG. 4, the system 100 first performs initialization at step 405. After initialization, the system 100 forms a desired template 310 that represents a desired image, in an optional step 410. The desired image may be an image of any of the semiconductor features previously discussed. As recited earlier, the desired template 310 may be formed using a scanning apparatus 120, for example the focused beam apparatus 130. However, as also mentioned earlier, the desired template 310 may be formed in a previous step not described, and stored on an external medium. The desired template 310 may then be stored in a first memory.

After forming the desired template in an optional step 410, an actual template 320 is formed in a step 415. The actual template 320, as disclosed earlier, is a 3-dimensional representation of the actual image, obtained by using the scanning apparatus 120, and more preferably the focused beam apparatus 130, to take 2-dimensional slices of the actual image along the Z-dimension. In an advantageous embodiment, both the actual image 320 and the desired image 310 are obtained using the scanning subsystem 210 (FIG. 2).

After obtaining the actual template 320 and the desired template 310, the template comparison subsystem 220 (FIG. 2) compares the desired template 310 to the actual template 320, in a step 420. Following the comparison, in a step 425 the template comparison subsystem 220 forms a deviation template 330. As mentioned above, the deviation template 330 may be a mathematical comparison of the desired template 310 and the actual template 320. However, in an alternative embodiment the deviation template 330 may be an optical interference pattern of the desired template 310 and the actual template 320.

In a step 430, the actual image is modified using the deviation template 330 and the focused beam apparatus 130. In an exemplary embodiment, the focused beam apparatus 130 is a focused ion beam apparatus. By modifying the actual image, a defect in the actual image is being corrected. After modifying the actual image in a step 430, another comparison of the modified actual image and the desired image is conducted in a step 440. If the actual image substantially conforms to the desired image, then the process will terminate in a step 450. However, if the actual image does not substantially conform to the desired image, the process will revert back to step 415 and continue the process until the actual image substantially conforms to the desired image. Other embodiments of the present invention may have additional or fewer steps than described above.

For clarity, one complete exemplary embodiment of the dynamic template modification system that could be used to repair a defect on an actual semiconductor feature 110, such as a photolithographic mask, will be discussed below. Initially, the computer system 140, having a comparison software or firmware application located thereon, is linked to the focused beam apparatus 130. The focused beam apparatus 130 may then obtain a template of the actual semiconductor feature 110 and may store that template in a memory on the computer system 140. The computer system 140, using the software or firmware application, compares the actual image 320 to the desired image 310, which was obtained in a previous step and stored on another memory of the computer system 140. Upon comparing the actual image 320 and the desired image 310, the computer system 140 generates a deviation template 330, which represents the difference between the actual image 320 and the desired image 310. The computer system 140 then instructs the focused beam apparatus 130 to correct the actual semiconductor feature 110, using the deviation template 330 as a guide. The corrected actual semiconductor feature may then be compared to the desired image, where it may be determined whether the process should be repeated. This represent one complete advantageous embodiment where the dynamic template modification system 100 could be used, but one having skill in the art knows that many other embodiments are within the scope of the present invention.

Figure 5:
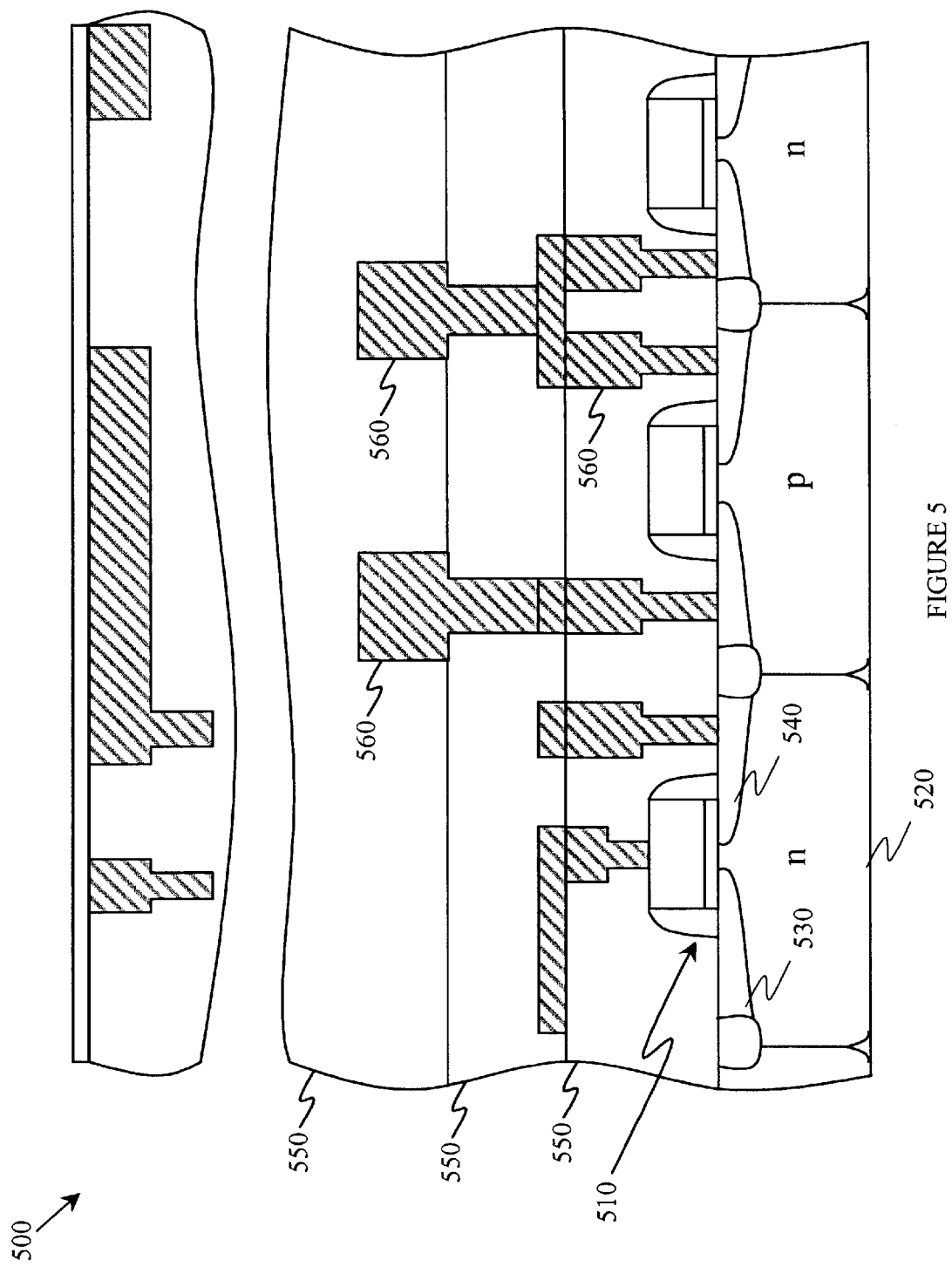
FIG. 5 illustrates an integrated circuit, which is one embodiment with which the present invention may be used.

Turning now to FIG. 5, there is illustrated an integrated circuit 500, which is one embodiment with which the present invention may be used. The integrated circuit 500 may include complementary metal oxide semiconductor (CMOS) devices, bipolar CMOS (BiCMOS) devices, dynamic random access memory (DRAM) devices, electrically erasable programmable read-only memory (EEPROM) devices, including Flash EPROMS, or any other type of similar device. Also shown in FIG. 5, are components of the conventional integrated circuit 500, including: a transistor 510, a semiconductor substrate 520, a source region 530, a drain region 540, and dielectric layers 550. Interconnect structures 560, located within the dielectric layer 550, electrically connect the transistors 510 to form the integrated circuit 500. As is known to those who are skilled in the art, each level of the integrated circuit 500 is sequentially formed to the designed number of levels of the integrated circuit 500. At each level, the present invention as set forth above may be employed to quickly correct any defect that may be present. Due to the ease and quickness of analysis provided by the present invention, integrated circuit waste and downtime are both substantially reduced, thereby, providing a more cost effective manufacturing process.

The method of forming a dynamic template with a focused beam, as discussed in detail above, is also very beneficial when applied to photolithographic masks. Likewise, in the semiconductor industry, in particular, there would be significant advantages to Micro Electro Mechanical device (MEMS) construction, micro machining and chip circuit modification and repair. A MEMS device might require the construction of a forest of phased array antennas constructed from a semiconductor material, which requires a variation of shape along their Z length, so as to be sensitive and responsive to acceleration forces. A MEMS fluid pump device might need a hole and plug geometry that needs a precise and variable fit to alter the amount of fluid pumped in response to some input. The present invention would also be very beneficial in this situation.

Moreover, as device geometries shrink, circuit modifications during design troubleshooting of prior levels of a chip require the removal and addition of a wide variety of material compositions. Because of the tight pitch and small line size, it will soon be necessary to "tunnel" at a slant into devices, because there is no direct top-down path due to obstructing features. This invention would also play an important role when this occurs. Thus, as has been exhibited, the present invention is very beneficial to those situations discussed and a myriad of others.

Although the present invention has been described in detail, those skilled in the art should understand that they can make various changes, substitutions and alterations herein without departing from the spirit and scope of the invention in its broadest form.

What is claimed is:

1. A dynamic template modification system for forming a semiconductor feature, comprising:
   a desired template that represents a desired semiconductor feature;
   a scanning subsystem that generates an actual template that represents an actual semiconductor feature;
   a template comparison subsystem, associated with the scanning subsystem, that analyzes the desired template and the actual template and generates a deviation template therefrom; and
   a dynamic formation subsystem, associated with the scanning subsystem and the template comparison subsystem, that modifies the actual semiconductor feature using the deviation template and a focused beam subsystem, to substantially conform the actual semiconductor feature to the desired semiconductor feature.

2. The system as recited in claim 1 wherein the scanning subsystem generates the desired template and the actual template.

3. The system as recited in claim 2 wherein the scanning subsystem includes a focused ion beam apparatus.

4. The system as recited in claim 1 wherein the desired template is a three-dimensional representation of the desired semiconductor feature.

5. The system as recited in claim 4 wherein the scanning subsystem creates a three-dimensional representation of the actual semiconductor feature by taking two-dimensional slices along a given dimension, and the template comparison subsystem analyzes the three-dimensional representation of the desired semiconductor feature and the three-dimensional representation of the actual semiconductor feature further.

6. The system as recited in claim 5 wherein the scanning subsystem includes a focused beam apparatus to create the three-dimensional representation of the actual semiconductor feature.

7. The system as recited in claim 1 wherein the template comparison subsystem analyzes the desired-template and the actual template using a mathematical comparison.

8. The system as recited in claim 1 wherein the template comparison subsystem and the dynamic formation subsystem use optical interference patterns to analyze and modify the actual semiconductor feature.

9. The system as recited in claim 1 wherein the actual semiconductor feature is a photolithographic mask.

10. The system as recited in claim 1 wherein the actual semiconductor feature contains defects.

11. The system as recited in claim 9 wherein the defects are positive or negative defects.

* * * * *